United States Patent
Low et al.

(10) Patent No.: US 8,165,832 B1
(45) Date of Patent: Apr. 24, 2012

(54) WALL PLUG POWER MONITOR

(75) Inventors: Kenneth Low, Campbell, CA (US);
Monica Maria Consuelo V. Bordador, Meycauayan (PH)

(73) Assignee: IXYS CH GmbH (CH)

( * ) Notice: Subject to any disclaimer, the term of this patent is extended or adjusted under 35 U.S.C. 154(b) by 530 days.

(21) Appl. No.: 12/291,574

(22) Filed: Nov. 12, 2008

(51) Int. Cl.
*G06F 19/00* (2011.01)

(52) U.S. Cl. .................................................. 702/60
(58) Field of Classification Search .................. 702/60
See application file for complete search history.

(56) References Cited

U.S. PATENT DOCUMENTS

| | | | | |
|---|---|---|---|---|
| 4,459,546 | A | * | 7/1984 | Arrington et al. ............ 324/142 |
| 5,017,860 | A | * | 5/1991 | Germer et al. ................ 324/142 |
| 5,548,209 | A | * | 8/1996 | Lusignan et al. ............. 324/142 |
| 6,147,484 | A | | 11/2000 | Smith ............................ 324/142 |
| 6,377,037 | B1 | | 4/2002 | Burns et al. ................... 324/142 |
| 6,397,155 | B1 | * | 5/2002 | Przydatek et al. .............. 702/61 |
| 6,476,729 | B1 | * | 11/2002 | Liu ........................... 340/870.11 |
| 6,975,951 | B1 | * | 12/2005 | Sutrave et al. ................ 702/106 |

OTHER PUBLICATIONS

"Kill-a-Watt Electricity Usage Monitor", brochure downloaded from Internet, http://www.p3international.com/brochures/P4400.pdf (2007).

"ACScout-V3" AC power monitor, via Internet, http://www.acscout.com/servlet/.1608cccl/page?template=productinformation &gclid=CJT00vbzrJUCFSCcnAodn3c8kg (downloaded Sep. 2008).

* cited by examiner

*Primary Examiner* — Edward Raymond
(74) *Attorney, Agent, or Firm* — Imperium Patent Works; T. Lester Wallace; Darien K. Wallace

(57) ABSTRACT

A wall plug power monitor accurately measures power consumption of an appliance connected via a wall plug power monitor to AC power supplies of any of the various frequencies used around the world. A three milliohm current sense resistor minimizes power consumption caused by current sensing. Digital oversampling and filtering methods allow for accurate calculation of voltage, current, and power consumption despite line noise and a minimized current sense resistor. Voltage sampling timed to correspond to positive-voltage pulses of voltage measurement signals and current sampling independently timed to correspond to positive-voltage pulses of current measurement signals allow the wall plug power monitor to be used with AC power supplies of varied and varying frequencies. A bit reservation system that scales values to preserve least significant digits allows accuracy while using an inexpensive integer-based processor.

24 Claims, 14 Drawing Sheets

| 1 | 1 | 1 | 1 | 1 | 1 | 1 | 1 | 1 | 1 |

FIG. 4

| 0 | 0 | 0 | 0 | 0 | 0 | 0 | 0 | 0 | 1 | 48

FIG. 5

| 1 | 1 | 1 | 1 | 1 | 1 | 1 | 1 | 1 | 1 |

FIG. 6

| 0 | 0 | 0 | 0 | 0 | 0 | 0 | 0 | 1 | 0 |

FIG. 7

| 0 | 0 | 0 | 0 | 0 | 0 | 0 | 0 | 0 | 1 | 49

FIG. 8

| 1 | 1 | 1 | 1 | 1 | 1 | 1 | 1 | 1 | 1 |

FIG. 9

| 0 | 0 | 0 | 0 | 0 | 0 | 0 | 0 | 0 | 1 | 50

FIG. 10

WALL PLUG POWER MONITOR

TECHNICAL FIELD

The described embodiments relate to electric measuring devices, and more particularly to a device for measuring the power usage of an alternating current load.

BACKGROUND INFORMATION

As consumers become more concerned with energy usage, interest in devices for monitoring the energy consumption of home appliances has grown. Manufacturers have made available power strips and power outlet devices that plug in to power outlets and allow a user to read various energy consumption parameters of an appliance that draws power from the power outlet. However, available energy consumption monitoring devices can be improved upon.

First, while home power monitors are typically employed in an effort to reduce power consumption, such devices initially add to power consumption because they must, themselves, draw power. Typically, the impedance of a current sensor employed by a power monitoring device causes undesired power dissipation, with larger impedances resulting in larger dissipation. Smaller impedances reduce power dissipation, but present accuracy problems in measuring the voltage and current on a noisy AC line. It is therefore desired reduce the power consumption of a power monitoring device while maintaining accuracy of voltage and current measurements.

A second concern with home power monitors is cost. A user is typically motivated to monitor power usage in order to save on energy expenditures. The high cost of power monitoring devices vitiates some of those savings. An objective is therefore to reduce the cost of a power monitoring device by using techniques to eliminate the need for some expensive components.

A third concern with home power monitors is compatibility with a given power distribution system. Home power monitors typically are able to measure power parameters of an appliance connected to either a 50 Hz or a 60 Hz alternating current. A power monitor is desired that adjusts to the current and voltage of the electrical current, thereby allowing a manufacturer to produce a home power monitor that works in any part of the world.

SUMMARY

A wall plug power monitor circuit accurately calculates a power parameter related to power consumption of an appliance connected via the wall plug power monitor to an AC line power supply. The AC line power supply can have a frequency of any of the various frequencies used around the world (for example, 50 Hz or 60 Hz). The term "power parameter" as it is used here may include a watt-hour value, a peak current value, an average current value, a peak voltage value, an average voltage value, an AC frequency value, a watt value, and other values.

In a novel aspect, the wall plug power monitor circuit uses a current sense resistor of a small three milliohms to minimize power dissipation when the current sense resistor is used for current measurement. The sense voltage signal developed across the three milliohm current sense resistor is measured in the microvolt range. Line noise on a typical residential AC power supply is in the millivolt range and can thus overwhelm the desired measurement voltage. To address this problem, digital filtering is used to separate signal from noise. In a digital filtering operation, a current measurement signal from the three milliohm current sense resistor is sampled fifty-six or more times during a cycle of the current measurement signal, using an analog-to-digital signal converter (ADC), and the digital current samples are time-averaged to calculate an accurate current measurement for that cycle. Time-averaged current measurements are then made for additional successive cycles, and the time-averaged current measurements for each measured cycle are again time-averaged to further increase accuracy of the current measurement.

In a similar fashion, the ADC is used to provide fifty-six or more digital samples per cycle of a voltage measurement signal received from a voltage divider. Peak voltage measurements are determined using these digital voltage samples across successive cycles of the voltage measurement signal and time-averaged in order to filter out line noise and provide an accurate time-averaged RMS voltage measurement. The time-averaged voltage and current measurements are then used to calculate power consumption parameters of the appliance.

In a novel aspect of the invention, the power monitoring circuit adjusts the timing of the voltage and current sampling such that it can be used with AC power supplies of varying frequencies. A comparator detects the beginning and the end of a positive-voltage pulse of the voltage measurement signal. A timer determines the duration of this positive-voltage pulse of the voltage measurement signal. This timer-determined duration is then used as a sampling period by the timer to the time the following sets of digital voltage samples such that they correspond to additional successive cycles of the voltage measurement signal and to the time the following sets of digital current samples such that they correspond to additional successive cycles of the current measurement signal.

In one example, a 50 Hz AC power supply as commonly used in the United Kingdom and having a period of 20 ms is determined to have a positive-voltage pulse of 10 ms on the voltage measurement signal. The circuit thus times digital voltage samples to be taken during ten successive positive-voltage pulses of the voltage measurement signal, and digital current samples to be taken during ten successive positive-voltage pulses of the current measurement signal. If the frequency of the AC line power supply varies temporarily, or if the wall plug power monitor is used in a country with a different AC line power supply frequency, the power monitoring circuit adjusts the timing of voltage and current sampling so that calculation of power parameters remains accurate.

In a novel aspect, a reference voltage generator (VREF) is used to set the resolution of the ADC. The reference voltage sets the maximum and minimum voltage that may be measured by the ADC. In one example, a reference voltage of two volts sets the ADC maximum measurable voltage to two volts and the minimum measurable voltage to two millivolts. The reference voltage provided to the ADC may be changed by providing a reference voltage of one volt, setting the ADC maximum measurable voltage to one volt and the minimum measurable voltage to one millivolt.

In another novel aspect, the power monitoring circuit uses a bit reservation system to scale measured digital voltage values and digital current values. The values are scaled in order to avoid the loss of significant digits when power parameters are calculated without a floating point processor.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 4 shows the ten bits in the ADC when measuring a voltage of two volts on the voltage measurement signal after the maximum measurable voltage has been set to two volts using a two volt reference voltage.

FIG. 5 shows the ten bits in the ADC when measuring a minimum measurable voltage of two millivolts on the voltage measurement signal after the maximum measurable voltage has been set to two volts using a two volt reference voltage.

FIG. 6 shows the ten bits in the ADC when measuring a voltage of one volt on the voltage measurement signal after the maximum measurable voltage has been set to one volt using a one volt reference voltage.

FIG. 7 shows the ten bits in the ADC when measuring a voltage of two millivolts on the voltage measurement signal after the maximum measurable voltage has been set to one volt using a one volt reference voltage.

FIG. 8 shows the ten bits in the ADC when measuring a voltage of one millivolt on the voltage measurement signal after the maximum measurable voltage has been set to one volt using a one volt reference voltage.

FIG. 9 shows the ten bits in the ADC when measuring a voltage of two hundred millivolts on the current measurement signal after the maximum measurable voltage has been set to two hundred millivolts using a two hundred millivolt reference voltage.

FIG. 10 shows the ten bits in the ADC when measuring a voltage of two hundred microvolts on the current measurement signal after the maximum measurable voltage has been set to two hundred millivolts using a two hundred millivolt reference voltage.

DETAILED DESCRIPTION

Reference will now be made in detail to background examples and some embodiments of the invention, examples of which are illustrated in the accompanying drawings.

Figure 1:
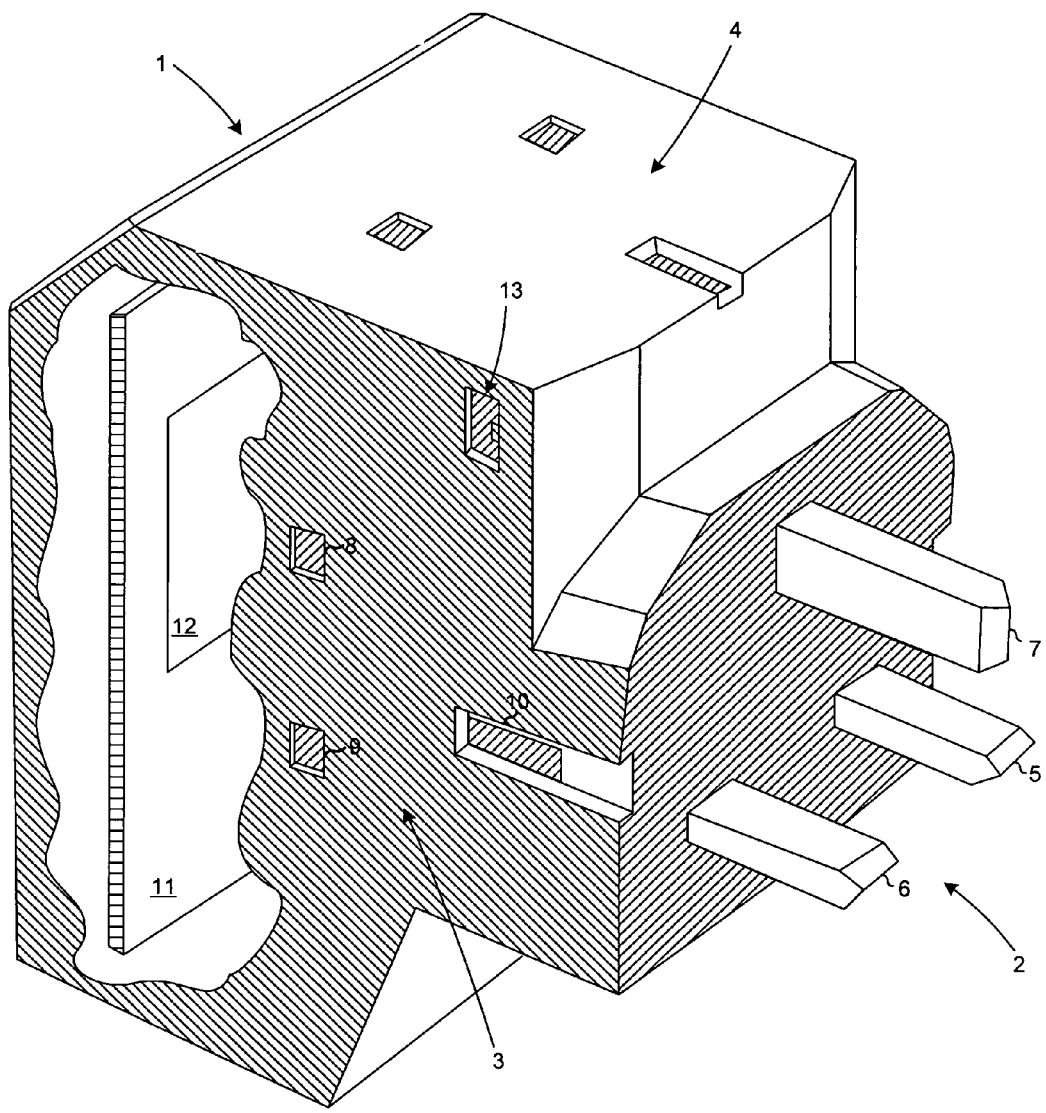
FIG. 1 is a simplified perspective view diagram of a wall plug power monitor, with cut-away view to show the interior.

FIG. 1 is a simplified perspective view diagram of an example wall plug power monitor 1. Example wall plug power monitor 1 includes a power input plug 2 for connecting the wall plug power monitor 1 to an AC source via a wall socket, a power output master socket 3 for connecting an appliance to the AC source via the wall plug power monitor 1, and an auxiliary power output socket 4 for connecting an additional appliance to the AC source via the wall plug power monitor 1. For purposes of illustration, power output master socket 3 is pictured on the facing side of the wall plug power monitor 1. However, power output master socket 3 and auxiliary power output socket 4 may be located on other faces of the wall plug power monitor 1, such as the top, front, or bottom face. Additional auxiliary power output sockets may also be included.

The power input plug 2 and power output sockets 3 and 4 are pictured as the BS1363 type of grounded plug and socket commonly used in the United Kingdom. However, the wall plug power monitor 1 may be made using grounded plug/socket configurations commonly in use in any country, or with ungrounded plug/socket types such as the Europlug.

The power input plug 2 shown includes a T1 Main 5, a T2 Neutral 6, and T3 Earth Ground 7. Power output socket 3 shown includes T5 Master Main 8, T6 Master Neutral 9, and T4 Master Earth Ground 10.

A cutaway view shows a printed circuit board 11 contained within the housing of the wall plug power monitor 1. Disposed on printed circuit board 11 is a power monitoring circuit 12.

Wall plug power monitor 1 also includes a data port 13 for communicating with a user's personal computer. The data port 13 may be, for instance, and RS-232 port, USB port, or other sort of data port. Alternatively, the wall plug power monitor 1 may communicate via a radio frequency transmitter, infrared transmitter, or other type of transmitter. Alternatively, the wall plug power monitor may use a visual display to communicate data to a user.

Figure 2:
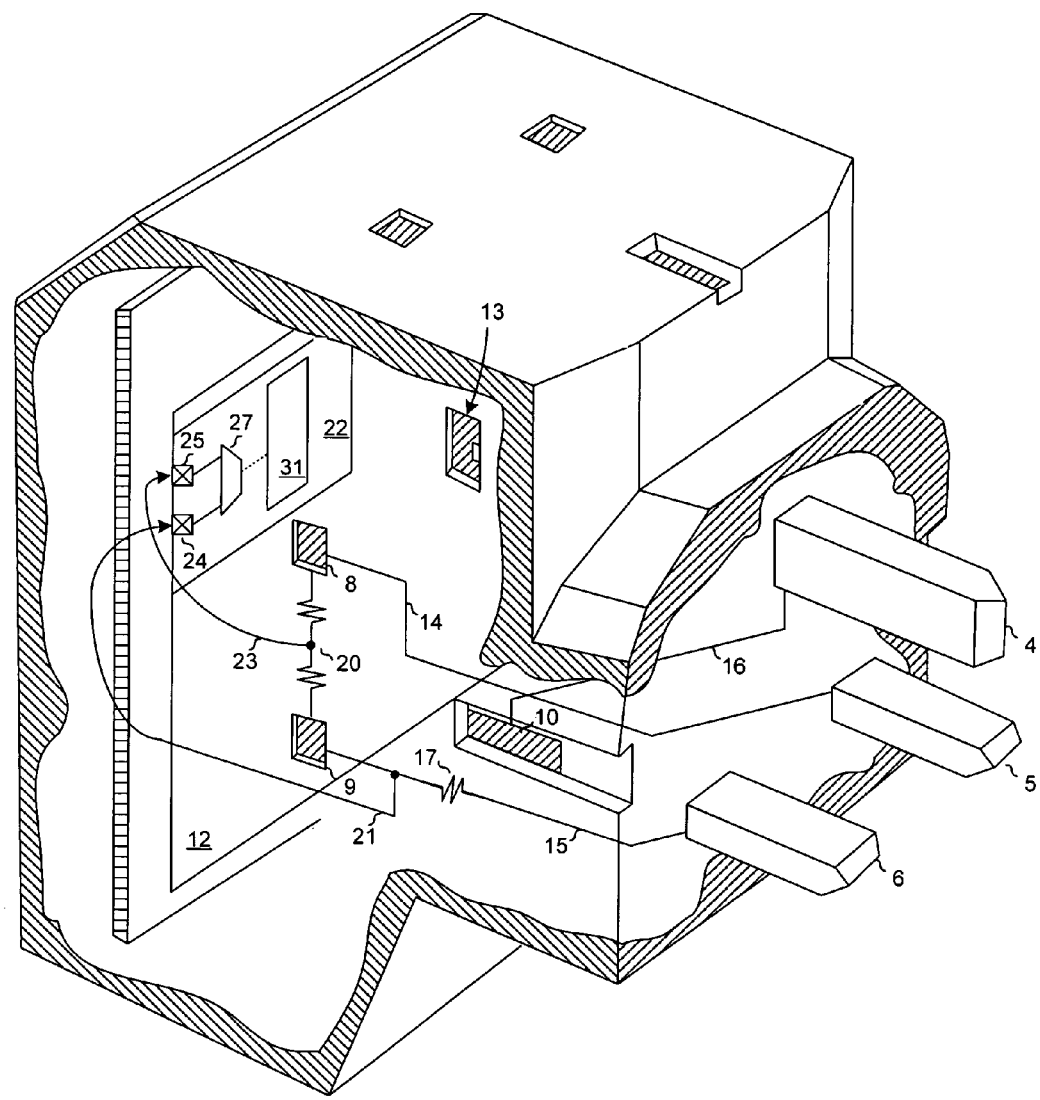
FIG. 2 is a simplified perspective view diagram of a wall plug power monitor, with expanded cut-away view to show additional details.

FIG. 2 is a simplified perspective view diagram of example wall plug power monitor 1 showing additional details. Power monitoring circuit 12 is disposed within the wall plug power monitor 1. T1 Main 5 connects via AC main 14 to T5 Master Main 8. T2 Neutral 6 connects via AC neutral 15 to T6 Master Neutral 9. T3 Earth Ground 7 connects via ground line 16 to T4 Master Earth Ground 10.

Line 21 conveys a current measurement signal indicative of the voltage drop across current sense resistor 17 through a terminal 24 to a first multiplexer 27 disposed within the microcontroller 22. Line 23 conveys a voltage measurement signal indicative of the AC power supply voltage from the voltage divider 20 through a terminal 25 to the first multiplexer 27 disposed within the microcontroller 22.

The Power Monitoring Circuit

Figure 3:
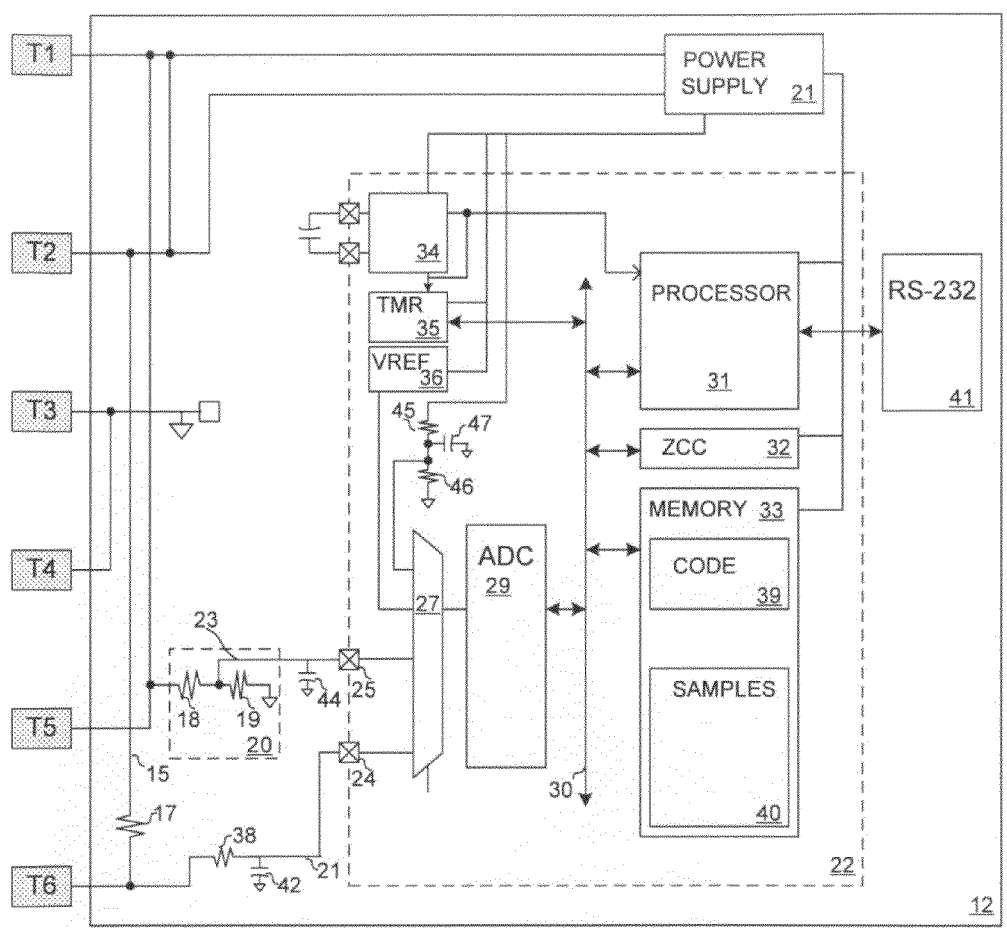
FIG. 3 is a simplified circuit diagram of a power monitoring circuit using.

FIG. 3 is a simplified diagram of the power monitoring circuit 12 disposed on printed circuit board 11. The power monitoring circuit 12 includes a current sensor 17, a voltage sensor 20, 3.3V power supply 21, data port interface circuit 41, and a microcontroller 22.

Microcontroller 22 includes (input terminals 24 and 25), a multiplexer 27, an ADC 29, data bus 30, processor 31, comparator 32, memory 33, clock signal generator 34, a timer 35, and a reference voltage generator 36. In the preferred embodiment, the clock signal generator 34 is a 5.45 Mhz Internal Precision Oscillator (IPO).

The microcontroller 22 receives analog current measurement and voltage measurement signals and processes them to calculate power consumption parameters of the load connected to the wall plug power monitor 1. The memory 33 stores code 39 which, when executed by the processor 31, causes the processor 31 to control the components of the microcontroller 22 to convert the received analog current measurement signals and analog voltage measurement signals into digital current samples and digital voltage samples, store the samples 40 in the memory 33, and process those samples in order to measure the power consumption of an appliance connected to the wall plug power monitor 1.

In a novel aspect, the current sensor 17 is a three milliohm resistor. Line 21 conveys a current measurement signal indicative of the voltage drop across the three milliohm current sense resistor 17 through a terminal 24 to the microcontroller 22. The current measurement signal from the current sensor 17 is a voltage signal in the microvolt range which, along with the known impedance of the current sense resistor; is used to compute the current. A two hundred ohm resistor 38 and 0.1 uF capacitor 42 on line 21 act as a noise filter.

In the microcontroller, the current measurement signal is provided to multiplexer 27 which can be controlled to provide time separated current sampling signals to the ADC 29. The ADC 29 can then be controlled to provide digital current samples representative of and proportional to the analog current measurement signal. Digital current samples are passed to the data bus 30 for processing by the processor 31 and comparator 32.

In another embodiment, the zero-crossing comparator functionality is implemented using an analog comparator. A first input lead of the comparator is coupled to a selectable one of terminal 25 and terminal 24. A second input lead of the comparator is coupled to a reference voltage (for example, ground). An output lead of the comparator is readable by processor 31 (for example, via an interrupt controller).

Processed digital current samples are then stored in the memory 33. These stored digital current samples can then be used in conjunction with stored digital voltage samples to calculate power consumption parameters.

Voltage divider 20 is comprised of input impedance resistor 18 and output impedance resistor 19. In the illustrated embodiment, input impedance resistor 18 is a thirty-three thousand ohm resistor and output impedance resistor is a two hundred ohm resistor. Line 23 conveys a voltage measurement signal indicative of the AC main 14 voltage from the voltage divider 20 through a terminal 25 to the microcontroller 22. A one thousand pF capacitor 44 on line 21 acts as a noise filter.

In the microcontroller 22, the voltage measurement signal is provided to multiplexer 27 which can be controlled to provide time separated voltage sampling signals to the ADC 29. The ADC 29 can then be controlled to provide digital voltage samples representative of and proportional to the analog voltage measurement signal. Digital voltage samples are passed to the data bus 30 for processing by the processor 31 and comparator 32. Processed digital voltage samples are then stored in the memory 33. These stored digital voltage samples can then be used in conjunction with stored digital current samples to calculate power consumption parameters.

Timing of Digital Voltage Samples and Digital Current Samples

In the preferred embodiment, the processor 31 uses the clock signal generator 34 to time digital voltage and current samples with a minimum separation of 46.3 microseconds. In practice, the processor 31 causes fewer samples than it is capable of timing to be taken, in order to minimize the amount of memory needed to store them. Thus, in the preferred embodiment, seventy samples are taken during the ten milliseconds of a positive voltage half-cycle or "positive voltage pulse" of a 50 Hz signal. More samples would be taken if the frequency varies to over 50 Hz; fewer samples would be taken if the frequency varies to under 50 Hz. During the 8.33 millisecond duration of a positive voltage pulse of a 60 Hz signal, fifty-six samples would be taken. The time-separated digital current samples and digital voltage samples are taken and stored in the memory 33 for use in digital filtering, time-averaging, and power parameter calculation as described below.

In the preferred embodiment, the ADC 29 is a sigma-delta ADC of the sort disclosed by U.S. Pat. No. 6,839,010 to Tsyrganovich entitled "Sigma-delta analog-to-digital converter with reduced quantization noise" and by U.S. Pat. No. 7,362,255 to Tsyrganovich entitled "Chopping and sampling ADC having reduced low-frequency drift". Because the ADC in this embodiment reads only positive voltages on the voltage measurement signal and current measurement signal, the multiplexer 27 is controlled to provide the time separated digital current samples signals and time separated digital voltage samples during positive voltage pulses of the signal cycles.

Using the Reference Voltage Generator to Set the Resolution of the ADC in Order to Read the Voltage Measurement Signal In the preferred embodiment, the ADC 29 uses ten bits to represent digital voltage samples and digital current samples. In a novel aspect of the invention, the reference voltage generator 36 can be used to change the scale of the measurements made by the ADC 29 by changing the maximum voltage measurable using the ten bits. The voltage of a signal output by the reference voltage generator 36 sets the maximum voltage that can be measured by the ADC 29.

Where, for example, the voltage of the voltage measurement signal received from the voltage divider 20 is expected to be two volts or lower, the reference voltage generator 36 is caused to convey a two volt reference voltage signal to the ADC 29. FIG. 4 shows the state of the ten bits set in the ADC 29 to correspond to the two volt reference voltage. The maximum voltage on a subsequently received measurement signal that can be represented using the ten bits of the ADC 29 set to values of 'one' is thus two volts.

FIG. 5 shows the state of the ten bits when the ADC 29, having been set to measure a maximum voltage of two volts, subsequently receives a measurement signal with a positive voltage of two to four millivolts. With the least significant bit 48 set to 'one' and all other bits set to 'zero', a voltage of at least two and less than four millivolts is represented. Less than two millivolts is read as zero millivolts. Thus, a resolution of two millivolts can be achieved in cases where, for example, the wall plug power monitor 1 is measuring the voltage on a 230V AC power supply as used in the United Kingdom.

If the voltage of the voltage measurement signal received from the voltage divider 20 is expected to be one volt or lower, the reference voltage generator 36 is caused to convey a one volt reference voltage signal to the ADC 29. FIG. 6 shows the state of the ten bits when the ADC 29, having been set to measure a maximum voltage of one volt, subsequently receives a measurement signal with a positive voltage of one volt or less. The maximum voltage on a subsequently received measurement signal that can be represented using the ten bits of the ADC 29 set to values of 'one' is thus one volt.

FIG. 7 shows the state of the ten bits when the ADC 29, having been set to measure a maximum voltage of one volt, subsequently receives a measurement signal with a positive voltage of two millivolts. With the second least significant bit set to 'one' and all other bits set to 'zero', a voltage of between two and four millivolts is represented. FIG. 8 shows the state of the ten bits when the ADC 29, having been set to measure a maximum voltage of one volt, subsequently receives a measurement signal with a positive voltage of one and two millivolts. With the least significant bit 49 set to 'one' and all other bits set to 'zero', a voltage of less than two millivolts and as low as one millivolt is represented. Thus, a resolution of one millivolt can be achieved in cases where, for example, the wall plug power monitor 1 is measuring the voltage on a 120V AC power supply as used in North America, allowing for increased accuracy in the computation of power parameters.

Using a Reference Voltage to Set the Resolution of the ADC in Order to Read the Current Measurement Signal To calibrate the ADC 29 for measuring the voltage of the current measurement signal output from the current sense resistor 17, a reference voltage of two hundred millivolts is provided to the ADC. This two hundred millivolt reference voltage sets the maximum voltage that can be measured by the ADC 29 to two hundred millivolts. This two hundred millivolt reference voltage is provided to the ADC 29 by sending a 3.3V signal from the power supply 21 through a voltage divider consisting of 10,700 Ohm input impedance resistor 45, 680 Ohm output impedance resistor 46, and 1000 pF capacitor 47.

FIG. 9 shows the state of the ten bits set in the ADC 29 to correspond to the two hundred millivolt reference voltage. The maximum voltage on a subsequently received measurement signal that can be represented using the ten bits of the ADC 29 set to values of 'one' is thus two hundred millivolts.

FIG. 10 shows the state of the ten bits when the ADC 29, having been set to measure a maximum voltage of two hundred millivolts, subsequently receives a current measurement signal with a positive voltage of two hundred microvolts. With the least significant bit 50 set to 'one' and all other bits set to 'zero', a voltage of at least two hundred microvolts and less than four hundred microvolts is represented. Less than two hundred microvolts is read as zero volts. Thus, a resolution of two hundred microvolts can be achieved where plug power monitor 1 is measuring the voltage on the current measurement signal.

Voltage Measurement Signal Sampling

Figure 11:
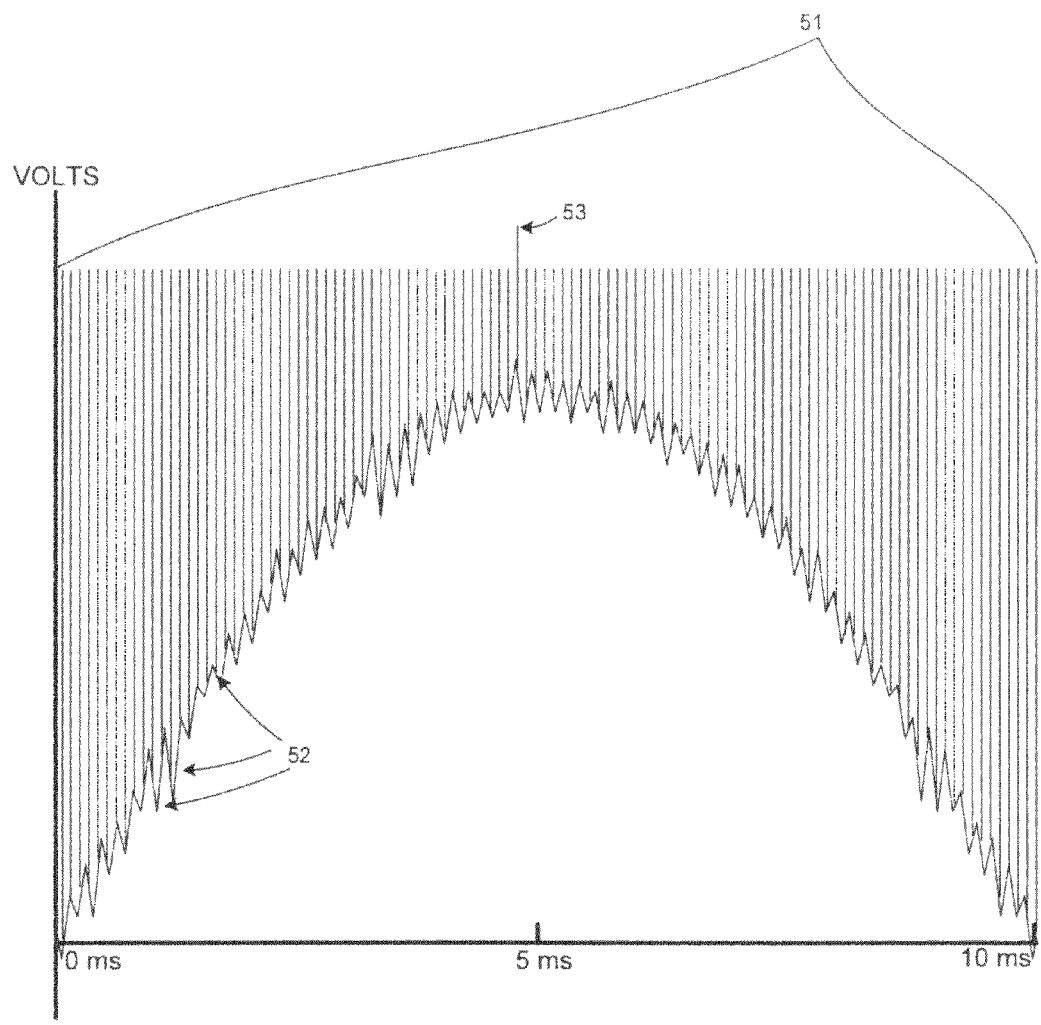
FIG. 11 is a waveform diagram showing one positive voltage pulse of a voltage measurement signal being sampled in order to detect the peak voltage.

FIG. 11 is a waveform diagram illustrating the taking of digital voltage samples 51 during a ten millisecond positive voltage pulse of a 50 Hz AC signal using the voltage measurement signal conveyed from the voltage divider 20 to the ADC 29. Because the ADC 29 measures only positive voltage values, the pulse pictured is the positive voltage half of the cycle. Irregularities 52 pictured in the sine wave (not to scale) indicate line noise of approximately fifty millivolts that can be expected in the voltage measurement signal when measuring residential AC power.

The ADC 29 receives the voltage measurement signal from the voltage divider 20 and takes time-separated digital voltage samples 51 by converting the analog voltage measurement signal to digital signals indicative of the voltage values. The comparator 32 is used to successively compare the most recent digital voltage signal to the previous one. The processor 31 retains the highest digital voltage sample 53 and stores it in the memory 33.

Figure 12:
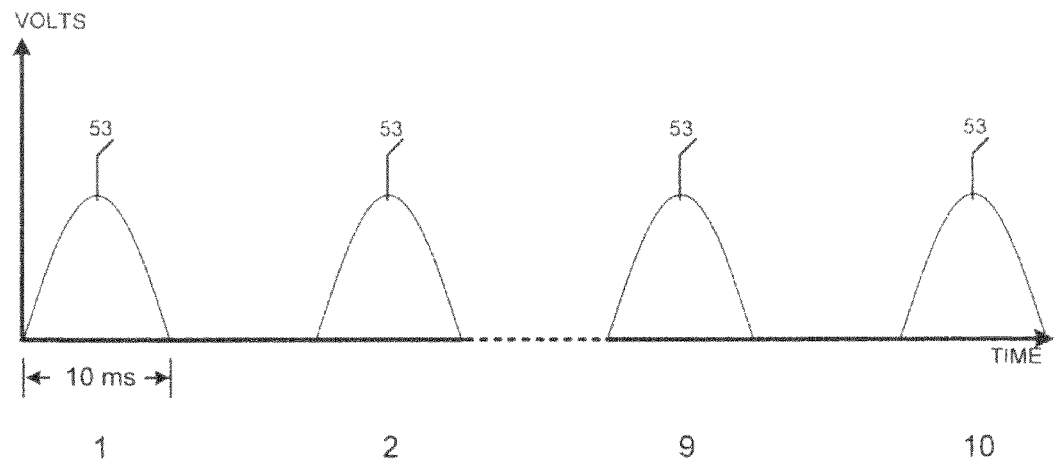
FIG. 12 is a simplified waveform diagram showing peak voltage being detected across ten cycles of a voltage measurement signal, corresponding to the peak voltage detection of FIG. 11.

FIG. 12 is a waveform diagram illustrating peak voltage samples 53 being determined during ten successive positive voltage pulses of the voltage measurement signal, as described according to FIG. 11. The ten stored peak voltage samples 53 are then time-averaged to filter out line noise. This time-averaged peak voltage value is retained in the memory 33 and may be used in calculating power parameters of the AC power supply.

Current Measurement Signal Sampling

Figure 13:
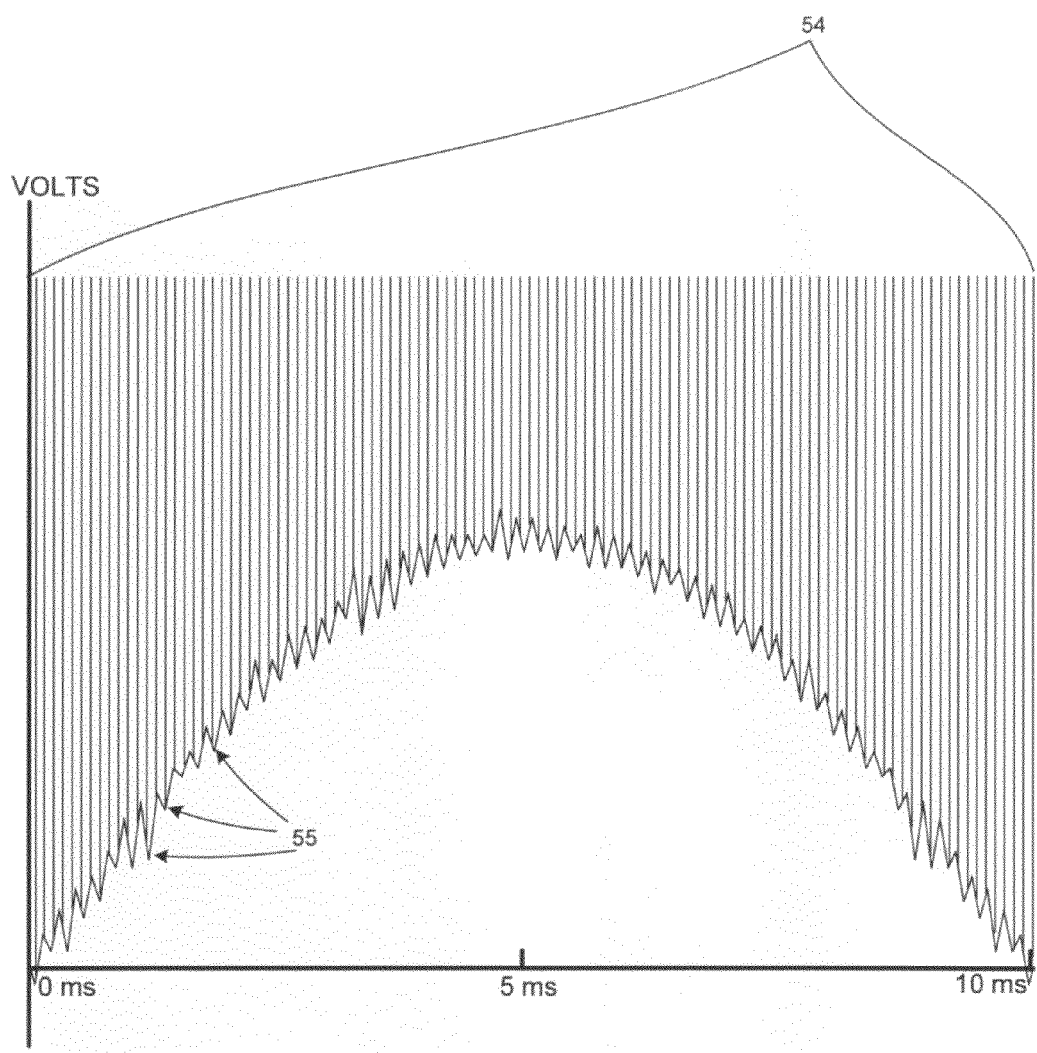
FIG. 13 is a waveform diagram showing one positive voltage pulse of a current measurement signal being sampled in order to calculate current.

FIG. 13 is a waveform diagram illustrating the taking of digital current samples 54 during a positive voltage pulse of a 50 Hz AC signal using the current measurement signal conveyed from the current sense resistor 17 to the ADC 29. Because the ADC 29 measures only positive voltage values, the pulse pictured is the positive voltage half of the cycle. Irregularities pictured in the sine wave (not to scale) indicate line noise 55 of approximately fifty millivolts that can be expected in the current measurement signal when measuring residential AC power.

The ADC 29 receives the current measurement signal from the current sensor 17 and takes time-separated digital current samples 54 by converting the analog current measurement signal to digital signals indicative of the current measurement signal, which may then be time-averaged to calculate the current.

The voltage drop across the three milliohm resistor of the current sensor 17 conveys a current measurement signal in the microvolt range. Because the current measurement signal may carry line noise 55 in the fifty millivolt range, digital filtering is used to compensate. Each of the approximately fifty-six to seventy digital current samples 51 taken during the pulse is stored in the memory 33 and then time-averaged to compute an accurate current measurement for the pulse despite the line noise. This time-averaged current measurement is then stored in the memory 33.

Figure 14:
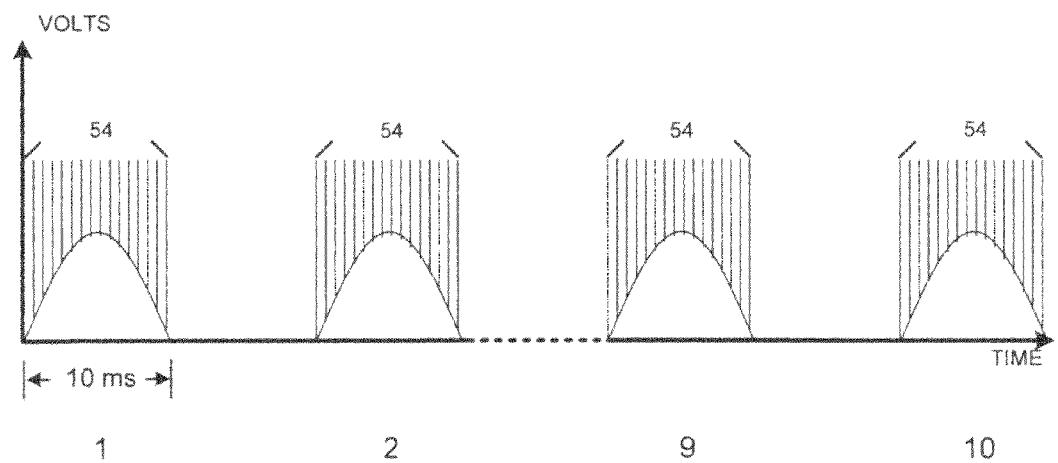
FIG. 14 is a simplified waveform diagram showing current being calculated across ten cycles of a current measurement signal, corresponding to the current sampling and calculation of FIG. 13.

FIG. 14 is a waveform diagram illustrating digital current samples 54 being taken during ten successive positive voltage pulses of the current measurement signal as described according to FIG. 13. The current measurements calculated for each of the ten pulses are stored in the memory 33 and a second time-averaging operation is performed using the current measurements calculated for each of the ten pulses, giving an overall time-averaged current measurement that is retained in the memory 33 and may be used in calculating power parameters. By this method, the time-averaged peak voltage value and time-averaged current measurement may be used to calculate an energy consumption parameter to an accuracy of less than one watt, despite the use of a very low resistance current sensor 17.

Adjusting the Sampling Period Duration to the Frequency of the AC Signal

Figure 15:
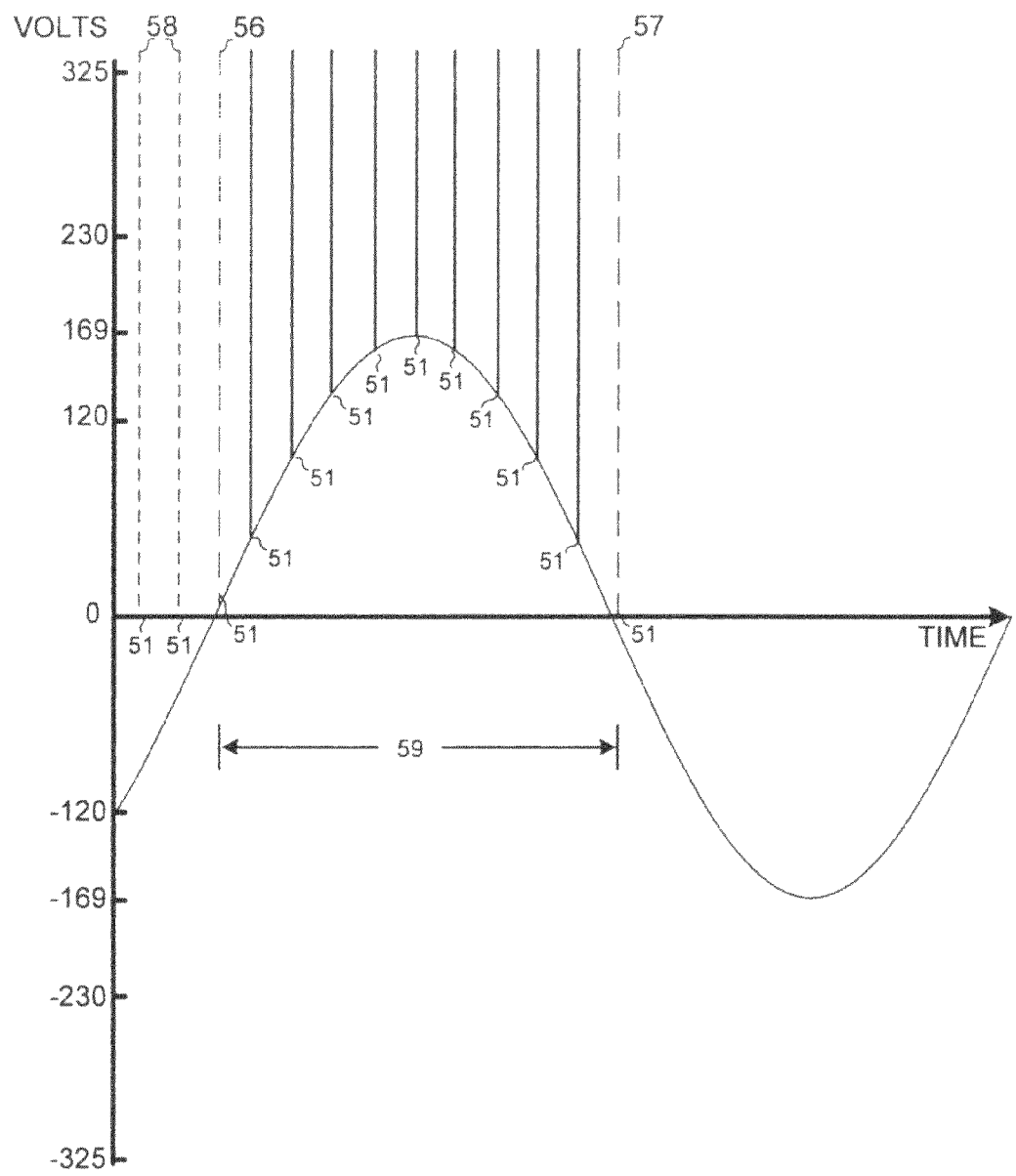
FIG. 15 is a waveform diagram of a positive-voltage pulse of a voltage measurement signal. The voltage measurement signal is representative of and proportional to the voltage on a 60 Hz AC power supply as commonly used in North America. The diagram indicates, as vertical lines, digital voltage samples being taken in order to determine peak voltage and, concurrently, to determine the duration of a positive-voltage pulse.

FIG. 15 is a waveform diagram illustrating the determination of the sampling period duration 59 to be used for digital voltage sampling and digital current sampling in accordance with a novel aspect of the invention. The depicted sine wave represents an analog voltage measurement signal of the 60 Hz frequency typical in North America. Vertical lines represent digital voltage samples 51 taken by the ADC 29.

To obtain an accurate current measurement in accordance with the current calculation method illustrated by FIG. 11 and FIG. 12, the wall plug power monitor must cause digital current sampling to coincide with the positive voltage pulses of the current measurement signal supplied from the current sense resistor 17 to the ADC 29. In a novel aspect of the invention, the microcontroller 22 adjusts the durations of the sampling periods illustrated in FIG. 11 and FIG. 12 using the timer 35. This adjusting of the durations of the current sampling periods allows the wall plug power monitor 1 to be used with AC currents of varied frequencies all over the world.

The durations of the sampling periods are equal to the duration of a positive voltage pulse of the voltage measurement signal as received from the voltage divider 20 in the discussion of FIG. 11. To determine this duration, the timer 35 is run from a start zero-crossing 56, which is a moment that the voltage measurement signal is determined to have crossed from negative to a positive voltage, and is halted at a stop zero-crossing 57, which is a moment that the voltage measurement signal is determined to have crossed from positive to negative voltage.

A start zero-crossing 56 is detected as a digital voltage sample 51 with a positive value immediately subsequent to a digital voltage sample with a value of zero, or 'zero sample' 58. Because the ADC 29 does not read negative voltages, both zero and negative voltages are returned to the processor as digital voltage value samples with a value of zero. A start zero-crossing 56 is thus detected as a digital voltage sample 51 with a positive value immediately subsequent to a zero sample 58.

To detect a start zero-crossing 56, the processor 31 causes the ADC 29 to begin returning digital voltage samples 51 until a zero sample 58 is returned. The first subsequent digital voltage sample 51 with a positive value is detected as a start zero-crossing 54. When the start zero-crossing 56 is detected, the timer 35 begins to run.

Digital voltage samples 51 which follow the start zero-crossing 56 may be used to determine peak voltage for the cycle as described above in regard to FIG. 4 and FIG. 5. A subsequent zero sample, as indicated by vertical line 57, means that a stop zero-crossing 57 has been detected. The timer 35 is stopped in response to the detection of the stop zero-crossing 57, and the timer value is stored as the sampling period duration in the memory 33.

Thus, where the wall plug power monitor 1 is monitoring a North American AC signal of a 60 Hz frequency, as shown in FIG. 15, the sampling period duration 59 will be determined by the timer 35 to be approximately 8.33 milliseconds, or one-half the period of the voltage measurement signal.

Figure 16:
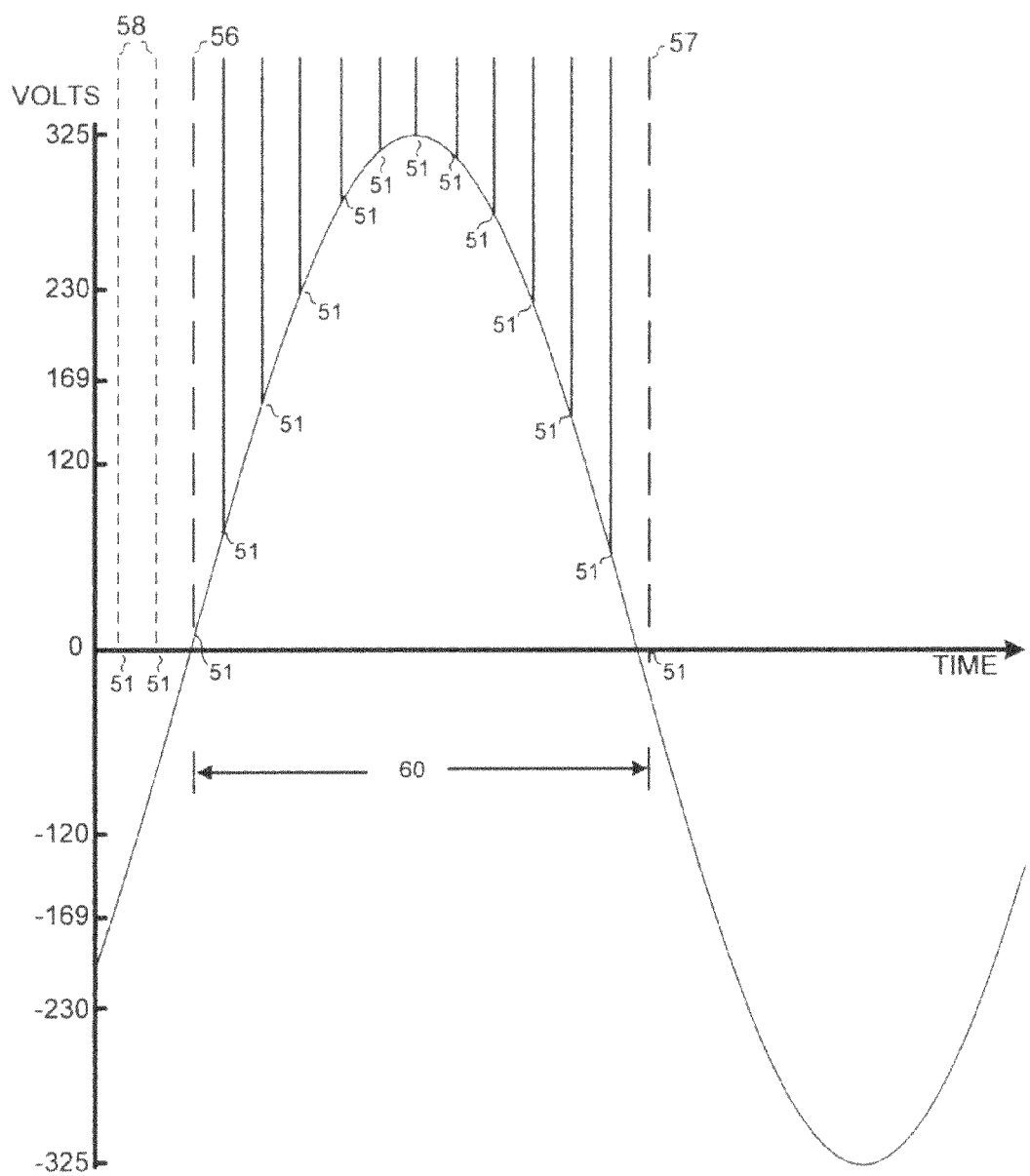
FIG. 16 is a waveform diagram of a positive-voltage pulse of a voltage measurement signal. The voltage measurement signal is representative of and proportional to the voltage on a 50 Hz AC power supply as commonly used in the United Kingdom. The diagram indicates, as vertical lines, digital voltage samples being taken in order to determine peak voltage and, concurrently, to determine the duration of a positive-voltage pulse.

FIG. 16 is a wave-form diagram illustrating the determination by the wall plug power monitor 1 of the sampling period duration 60 for an AC power supply of a 50 Hz frequency. The timer 35 determines the duration from the detection of the start zero-crossing 56 to the detection of the stop zero-crossing 57, allowing the wall plug power monitor 1 to adjust its sampling period for use in, for example, the United Kingdom. In this case, the sampling period duration 60 will be determined by the timer 35 to be approximately ten milliseconds, or one-half the period of the voltage measurement signal.

Figure 17:
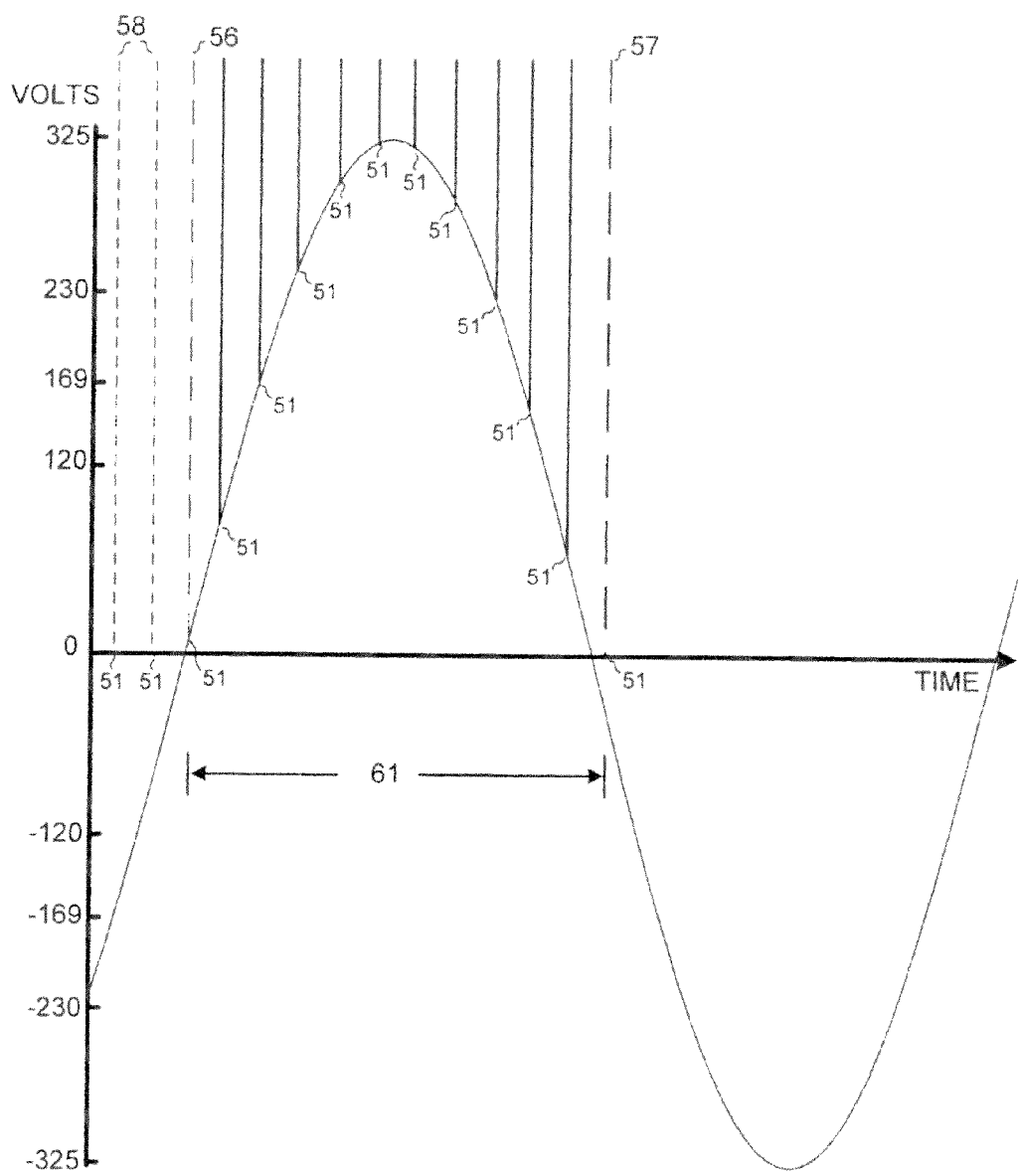
FIG. 17 is a waveform diagram of a positive-voltage pulse of a voltage measurement signal. The voltage measurement signal is representative of and proportional to the voltage on a 55 Hz AC power supply, representing non-standard power supply frequencies and/or frequency variations that may occur on power supplies of standard frequencies. The diagram indicates, as vertical lines, digital voltage samples being taken in order to determine peak voltage and, concurrently, to determine the duration of a positive-voltage pulse.

FIG. 17 is a wave-form diagram illustrating the determination by the wall plug power monitor 1 of the sampling period duration 61 for an AC power supply of a 55 Hz frequency. The timer 35 determines the duration from the detection of the start zero-crossing 56 to the detection of the stop zero-crossing 57, allowing the wall plug power monitor 1 to adjust its sampling period for use where the AC frequency varies from a standard 50 Hz or 60 Hz. The sampling period duration 61 will be determined by the timer 35 to be approximately 9.1 milliseconds, or one-half the period of the voltage measurement signal.

This in-situ adjustment of the sampling period duration allows the wall plug power monitor 1 to be used in countries where an AC signal of a non-standard frequency is in use. Additionally, in-situ adjustment of the sampling period duration allows the wall plug power monitor 1 to remain accurate when temporary frequency variations occur in a standard AC signal.

Figure 18:
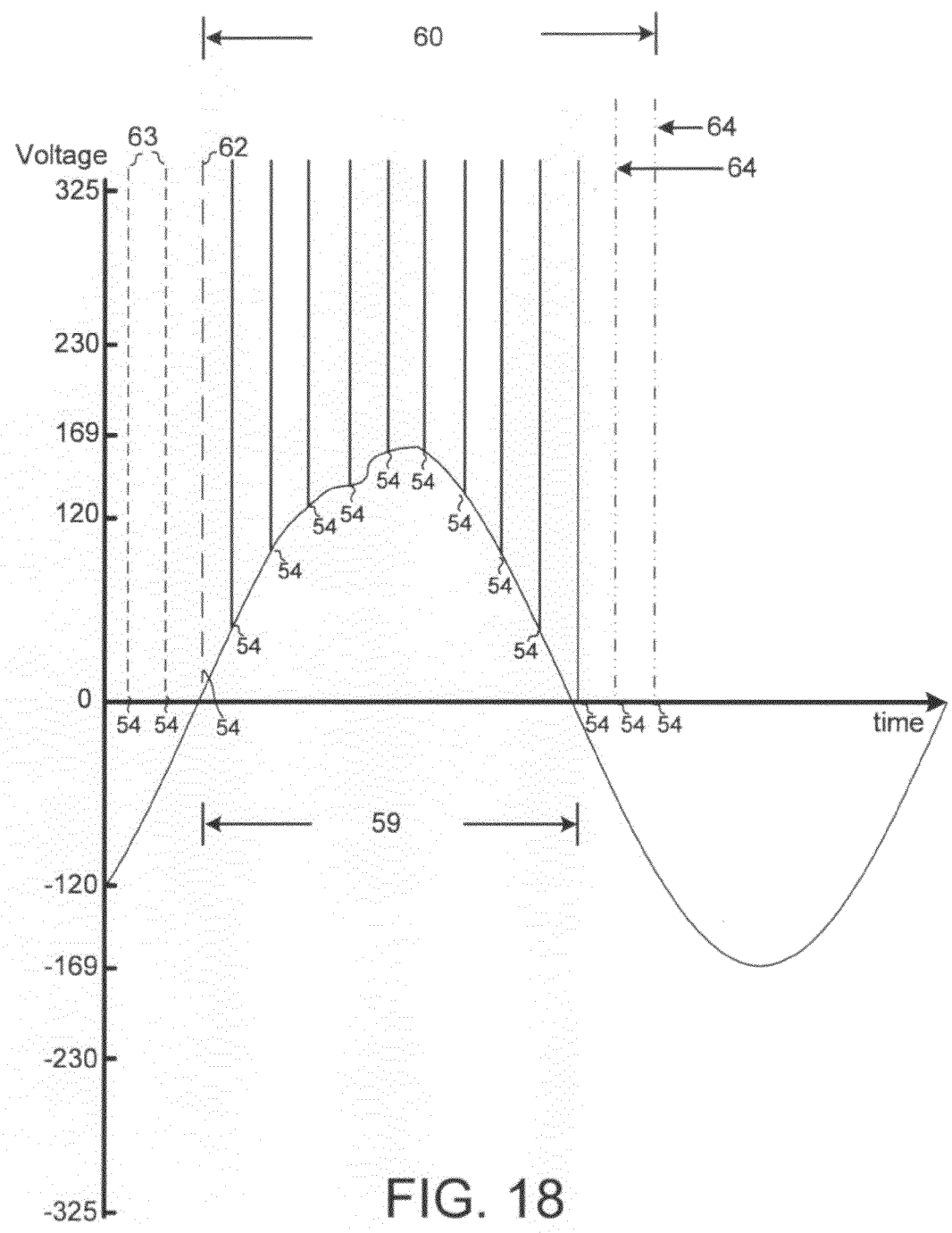
FIG. 18 is a waveform diagram of a positive-voltage pulse of a current measurement signal. The current measurement signal is representative of and proportional to the current on a 60 Hz AC power supply as commonly used in North America. The diagram indicates, as vertical lines, digital current samples being taken in order to calculate the area under the curve of the current measurement signal.

Current Measurement Signal Sampling Using In-Situ Adjusted Sampling Period Duration FIG. 18 is a wave-form diagram illustrating the use by the wall plug power monitor 1 of the in-situ adjusted sampling period duration 59 for current sense sampling in accordance with a novel aspect of the invention. The depicted irregular wave-form represents an analog current signal of the 60 Hz frequency typical in North America. Vertical lines represent digital current samples 54 taken by the ADC 29, as is explained above in regard to FIG. 13.

Because an AC current wave-form may not be precisely sinusoidal, current is determined by time-averaging regular digital current samples 54 across a positive voltage pulse of the current measurement. Digital current samples 54 are taken starting with a start zero-crossing and continuing for the duration of the sampling period 59 according to the timer 35, as determined above in regard to FIG. 15.

A start zero-crossing 62 for the purpose of beginning a current sampling period 61 is detected as a digital current sample 54 with a positive value immediately subsequent to a digital current sample with a value of zero, or 'zero sample' 63. Because the ADC 29 does not read negative voltages, both zero and negative voltages in the current measurement signal are returned to the processor 31 as digital current samples with a value of zero. A start zero-crossing 62 is thus detected as a positive digital current sample 54 immediately subsequent to a zero sample 63.

To detect a start zero-crossing 62, the processor 31 causes the ADC 29 to begin returning digital current samples 54 until a zero sample 63 is detected. The first digital current sample 54 with a positive value subsequent to a zero sample 63 is a start zero-crossing 62. When the start zero-crossing 62 is detected, the timer 35 begins to run for the duration of the sampling period 59 as determined according to the explanation of FIG. 15 and the digital current sample 54 taken at the start zero-crossing 62 is stored in the memory 33 as the first digital current sample 54 for that pulse.

Subsequent digital current samples 54 are also successively taken and stored in the memory 33 while the timer 35 runs for the duration of the current sampling period 59. In this case, the sampling period for the 60 Hz current will have been determined to be approximately 8.33 milliseconds. Because the duration of the current sampling period 59 corresponds to the duration of the positive voltage pulses of the current measurement signal, the digital current samples 54 taken and stored in the memory 33 can then be time-averaged to accurately calculate the area under the curve of the current measurement signal wave-form.

If digital current samples 54 were to be taken outside of the positive voltage pulse of the cycle were to be included in the time-averaging, the area under the curve of the current measurement signal wave-form would be inaccurately calculated. FIG. 18 includes an illustration of the effect of including additional digital current samples 64 taken within a ten millisecond sampling period 60 appropriate to a 50 Hz, rather than 60 Hz, current. These additional digital current samples 64 would be stored with values of zero and included in the time-averaging with the other, positive digital current samples 54, resulting in inaccurate current measurement. Because the current sampling period 59 duration is adjusted in-situ to the frequency of the signal, the wall plug power monitor 1 is accurate regardless of the frequency of the AC signal.

As is explained above in regard to FIG. 14, current is then calculated in this manner for nine more subsequent sampling periods. The current measurements for these ten sampling periods are then time-averaged a second time. This final time-averaged current measurement may then be used to calculate energy consumption to an accuracy of under one watt.

Figure 19:
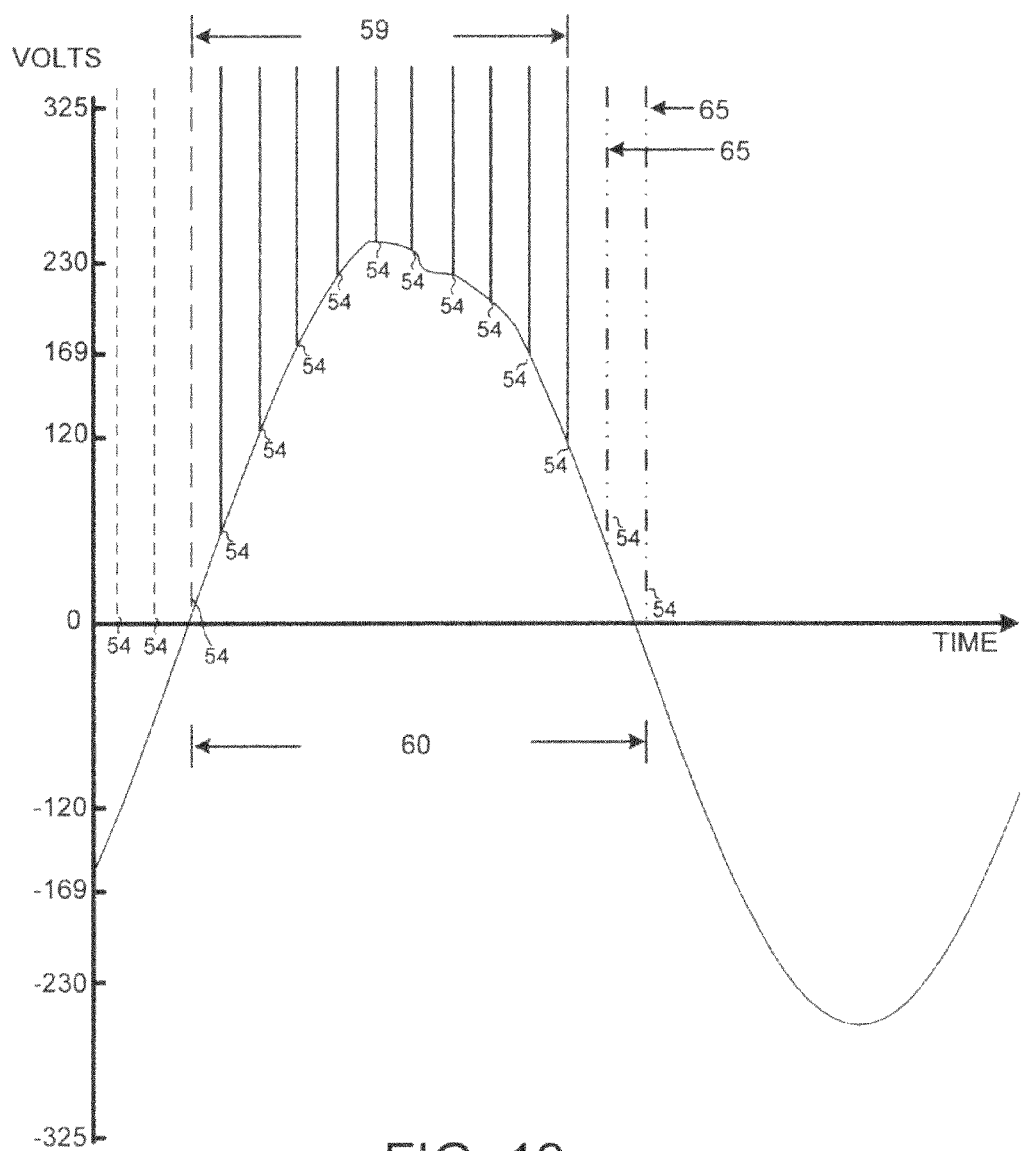
FIG. 19 is a waveform diagram of a positive-voltage pulse of a current measurement signal. The current measurement signal is representative of and proportional to the current on a 50 Hz AC power supply as commonly used in the United Kingdom. The diagram indicates, as vertical lines, digital current samples being taken in order to calculate the area under the curve of the current measurement signal.

Illustration of Inaccuracies Stemming from the Use of a Sampling Period Duration that is not Adjusted to the Period of the Current FIG. 19 is a wave-form diagram that illustrates the effect of using a current sampling period duration that is too short. The wave-form represents a current measurement signal for a 50 Hz AC current as employed in the United Kingdom. Digital current samples 54 fall within a 10 millisecond sampling period 60 appropriate to a 50 Hz current measurement signal. Vertical lines 65 represent digital current samples that would fall outside the 8.33 millisecond current sampling period 59 appropriate to a 60 Hz North American AC current. Failing to include these digital current samples 65 by using a sampling period appropriate to a North American 60 Hz power supply, and thus too short for a 50 Hz United Kingdom power supply, would cause the calculation of the area under the curve of the current measurement signal wave-form to be inaccurate. Because the current sampling period duration 60 is adjusted in-situ to the frequency of the signal, the wall plug power monitor 1 is accurate regardless of the frequency of the AC signal.

Figure 20:
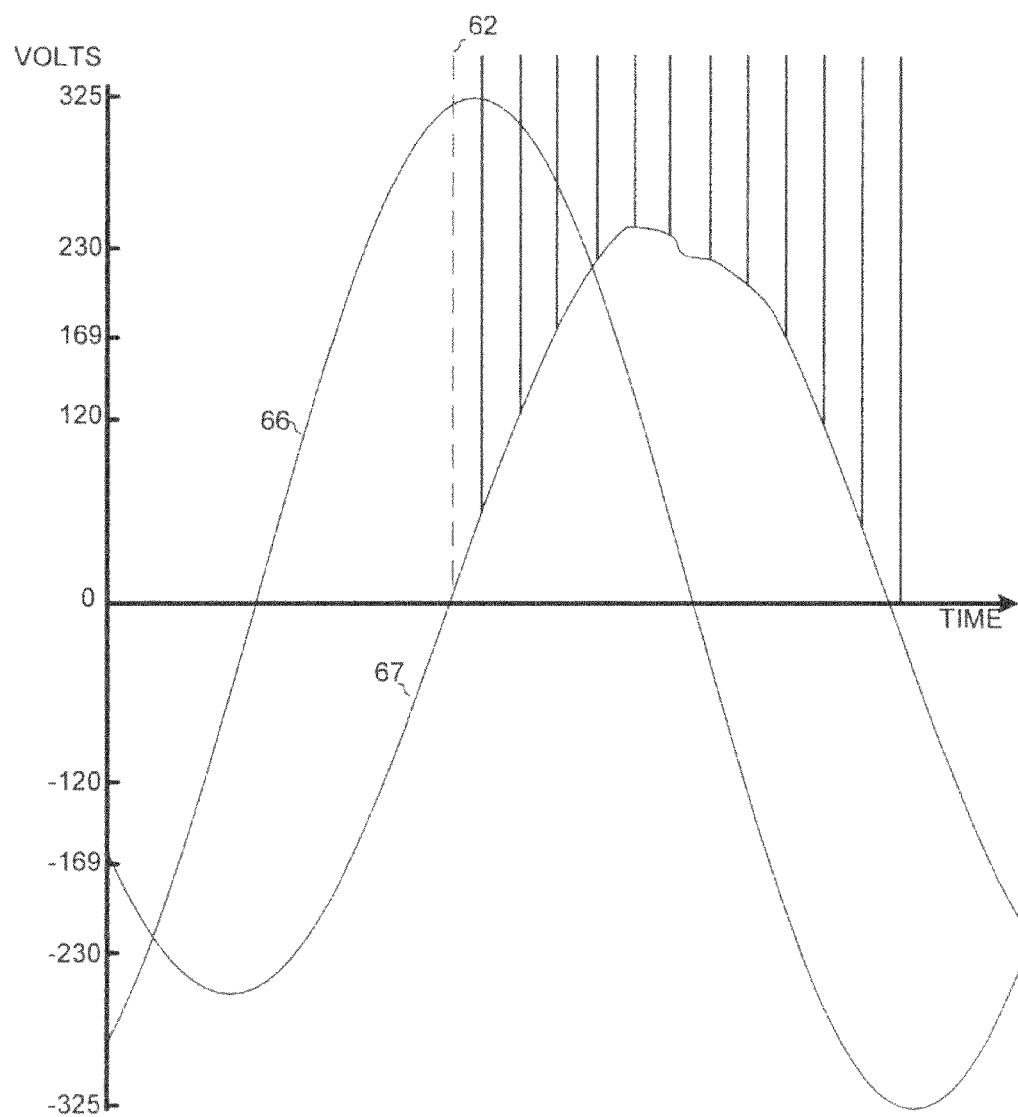
FIG. 20 is a waveform diagram showing a positive-voltage pulse of a voltage measurement signal and a positive-voltage pulse of a current measurement signal representative and proportional to the same 50 Hz AC power supply. Because the voltage wave-form and current wave-form are not in phase, digital current samples indicated as vertical lines are timed to correspond to a positive-voltage pulse of a current measurement signal.

FIG. 20 is a wave-form diagram of a 50 Hz AC power supply where the voltage and current are not in phase. Sine wave 66 represents the voltage measurement signal. Wave-form 67 represents the current measurement signal. Because current sampling starts with the detection of a start zero-crossing 62 of the current measurement signal 67, and because voltage and current measurements are time-averaged, current is calculated accurately regardless of whether or not the current measurement signal 67 is in phase with the voltage measurement signal 66.

Figure 21:
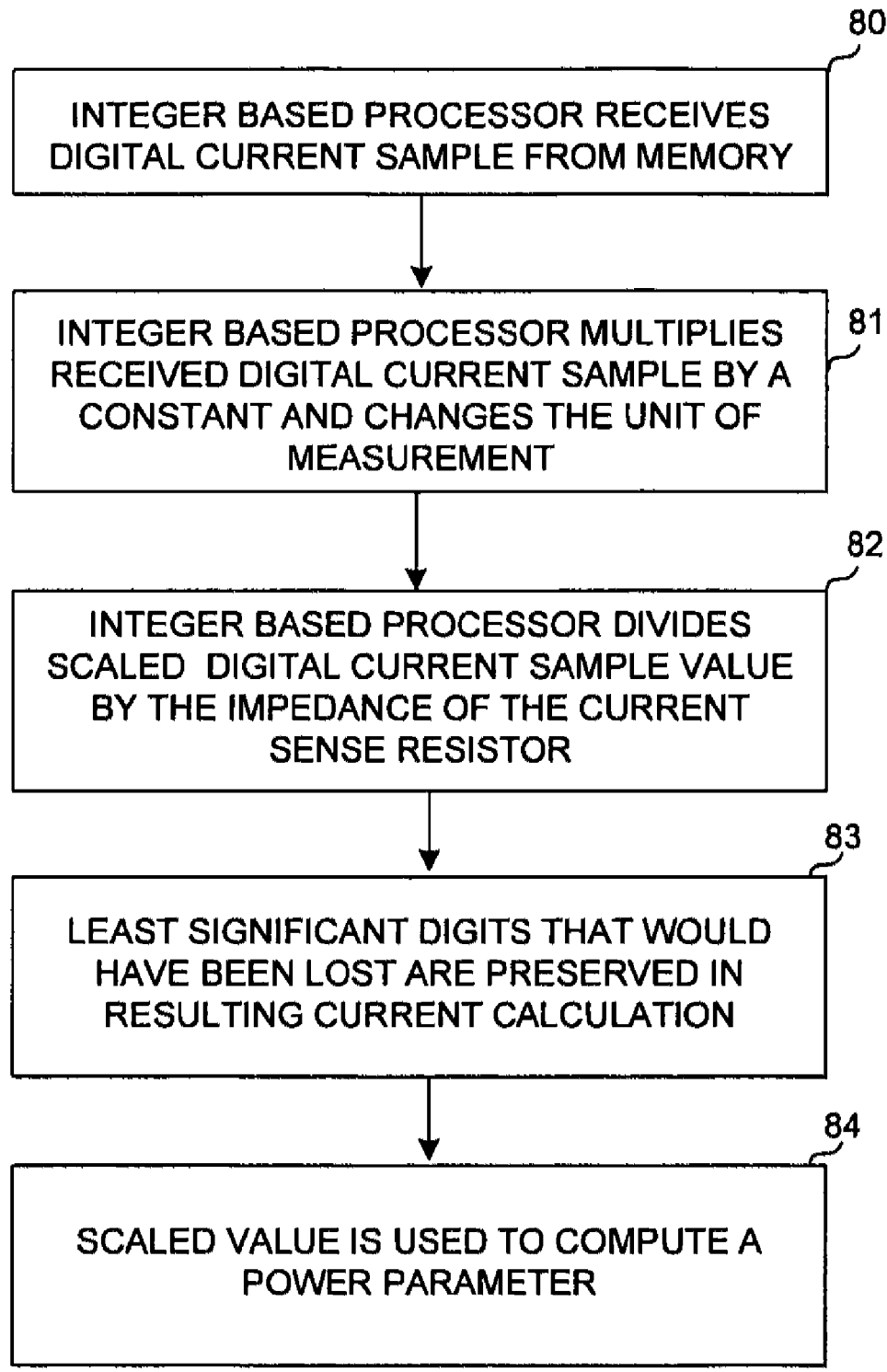
FIG. 21 is a flowchart explaining the use of bit reservation to avoid storing floating-point arithmetic code.

Scaling Values To Retain Least Significant Digits During Integer-Based Calculations FIG. 21 is a flow chart illustrative of a bit reservation system in accordance with another novel aspect. Due to resource constraints, the memory 33 does not store code 39 for floating-point arithmetic by the processor 31. Stored values which are subject to division operations in the course of calculating power parameters are first scaled by powers of ten before being divided. In step 80, the processor receives a value (for example, a digital current sample with a value of ten millivolts) from the memory. In step 81, the processor multiplies the value (for example, times one thousand) and changes the unit of measurement for the value (in this example, to microvolts). In step 82, the processor performs a division operation on the scaled value (for example, dividing the ten thousand microvolt digital current sample value by the three milliohm impedance of the current sense resistor). In step 83, a scaled integer value preserving least significant digits is arrived at (in this example, three thousand three hundred thirty-three microamps). In step 84, the scaled integer value is used to compute a power parameter (for example, a watt-hour value, a peak current value, a peak wattage).

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A device, comprising:
   an Analog-to-Digital Converter (ADC) that provides digital voltage samples representative of an AC voltage signal, and that provides digital current samples representative of an AC current signal;
   a current sense resistor having a resistance of less than ten milliohms, wherein the AC current signal flows across the current sense resistor;
   a Zero-Crossing Comparator (ZCC) that detects a beginning and an end of a voltage data sampling period and that detects a beginning of a current data sampling period;
   a Timer (TMR) operable to time a plurality of voltage data sampling periods and a plurality of current data sampling periods; and
   a processing circuit operable to receive from the ADC a plurality of the digital voltage samples representative of a peak voltage during each of the plurality of voltage data sampling periods and to receive from the ADC a plurality of the digital current samples representative of a peak current during each of the plurality of current data sampling periods.

2. The device of claim 1, wherein the processing circuit calculates at least one power parameter of a load using at least some of the plurality of the digital voltage samples and using at least some of the plurality of digital current samples.

3. The device of claim 1, wherein the processing circuit calculates and outputs a watt-hour value.

4. The device of claim 1, further comprising:
a memory that stores at least one of the plurality of digital voltage samples and at least one of the plurality of digital current samples.

5. The device of claim 1, wherein the ADC receives analog current measurement signals generated using the current sense resistor, wherein the ADC generates the digital current samples based on the analog current measurement signals, and wherein the processing circuit calculates a power consumption value to an accuracy of less than one watt.

6. The device of claim 1, wherein the processing circuit receives at least sixty-four digital voltage samples per voltage data sampling period.

7. The device of claim 1, wherein the processing circuit receives at least sixty-four digital current samples per current data sampling period.

8. The device of claim 1, wherein one of the voltage data sampling periods consists of a positive voltage portion of a period of the AC current signal.

9. The device of claim 1, wherein one of the voltage data sampling periods comprises a positive voltage portion of a period of the AC current.

10. The device of claim 1, wherein a timed duration of one of the current data sampling periods is substantially equal to a timed duration of one of the voltage data sampling periods.

11. The device of claim 2, wherein the calculating of at least one power parameter involves time-averaging.

12. A method, comprising:
(a) determining a voltage data sampling period of an alternating current flowing across a load;
(b) determining a current data sampling period of said alternating current;
(c) taking a plurality of digital voltage samples representative of a peak voltage during each of a plurality of voltage data sampling periods;
(d) taking a plurality of digital current samples representative of a peak current during each of a plurality of current data sampling periods, wherein the digital current samples are taken using a current sense resistor having a resistance of less than ten milliohms; and
(e) calculating at least one power parameter of said load using the digital voltage samples taken in step (c) and the digital current samples taken in step (d).

13. The method of claim 12, wherein at least one of the plurality of digital voltage samples and at least one of the plurality of digital current samples are stored in a memory.

14. The method of claim 12, wherein steps (a) through (e) are performed by a wall plug power monitor.

15. The method of claim 12, further comprising:
(f) communicating the at least one power parameter of said load calculated in step (e) to a user.

16. The method of claim 12, wherein a current data sampling period in step (b) is represented by at least sixty-four digital current samples.

17. The method of claim 13, wherein calculating the at least one power parameter of said load in step (e) involves time-averaging the digital current samples taken in step (d).

18. A wall plug power monitor comprising:
a current sense resistor having a resistance of less than ten milliohms, wherein an AC current signal flows across the current sense resistor; and
means for detecting a beginning and an end of a voltage data sampling period and for detecting a beginning of a current data sampling period, wherein the means is also for determining a plurality of voltage data sampling periods and a plurality of current data sampling periods, wherein the means is for taking a plurality of digital voltage samples during the plurality of voltage data sampling periods and for taking a plurality of digital current samples during the plurality of current data sampling periods, and wherein the digital current samples are representative of a peak current of the AC current signal during each of the plurality of current data sampling periods.

19. The wall plug power monitor of claim 18, wherein the means is also for calculating at least one power parameter using at least some of the plurality of digital voltage samples and at least some of the plurality of digital current samples.

20. The wall plug power monitor of claim 18, wherein the means includes a comparator and a timer.

21. The device of claim 1, wherein the ADC receives analog voltage measurement signals having different maximum voltages, wherein the ADC generates the digital voltage samples based on the analog voltage measurement signals, and wherein the ADC is set to measure the maximum voltage of each analog voltage measurement signal using a constant number of bits.

22. The device of claim 1, wherein the ADC receives analog current measurement signals having different maximum voltages, wherein the ADC generates the digital current samples based on the analog current measurement signals, and wherein the ADC is set to measure the maximum voltage of each analog current measurement signal using a constant number of bits.

23. The method of claim 12, wherein the power parameter is power consumption, and wherein power consumption is calculated in (e) to an accuracy of less than one watt.

24. The method of claim 12, wherein the power parameter calculated in (e) is a peak current value.

* * * * *